US012575177B2

(12) United States Patent
Lv et al.

(10) Patent No.: US 12,575,177 B2
(45) Date of Patent: Mar. 10, 2026

(54) LAYOUT STRUCTURE, SEMICONDUCTOR STRUCTURE AND MEMORY

(71) Applicant: CHANGXIN MEMORY TECHNOLOGIES, INC., Hefei City (CN)

(72) Inventors: Qing Lv, Hefei City (CN); Wei Jiang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 313 days.

(21) Appl. No.: 18/449,594

(22) Filed: Aug. 14, 2023

(65) Prior Publication Data

US 2024/0079411 A1     Mar. 7, 2024

Related U.S. Application Data

(63) Continuation of application No. PCT/CN2022/126213, filed on Oct. 19, 2022.

(30) Foreign Application Priority Data

Sep. 2, 2022     (CN) ......................... 202211073818.7

(51) Int. Cl.
*H10D 84/90*          (2025.01)
*H03K 19/0948*        (2006.01)

(52) U.S. Cl.
CPC ....... *H10D 84/907* (2025.01); *H03K 19/0948* (2013.01); *H10D 84/975* (2025.01); *H10D 84/981* (2025.01)

(58) Field of Classification Search
CPC .. H10D 84/907; H10D 84/975; H10D 84/981; H10D 89/10; H03K 19/0948
See application file for complete search history.

(56) References Cited

U.S. PATENT DOCUMENTS

| 9,601,545 B1 * | 3/2017 | Tu ........................... H10B 63/80 |
| 2005/0104133 A1 * | 5/2005 | Kanno ................... H10D 89/10 |
| | | 257/E27.062 |

(Continued)

FOREIGN PATENT DOCUMENTS

| CN | 101388391 B | 7/2012 | |
| CN | 112992892 A * | 6/2021 | ............. H10D 84/83 |

(Continued)

OTHER PUBLICATIONS

International Search Report in the international application No. PCT/CN2022/126213, mailed on Apr. 21, 2023. 6 Pages with English translation.

*Primary Examiner* — S M Sohel Imtiaz
(74) *Attorney, Agent, or Firm* — Syncoda LLC; Feng Ma

(57)          ABSTRACT

A semiconductor structure includes: a logic device including a first power line and a second power line located on a same wiring layer, extending along a first direction and arranged in parallel along a second direction, the first direction and the second direction intersecting with each other and being parallel to a plane where the wiring layer is located; and a switch driving device, the switch driving device and the logic device being arranged in parallel along the first direction, the switch driving device including a first input line and a first output line located on the same wiring layer as the first power line, extending along the first direction and arranged in parallel along the second direction, the first output line being connected with the first power line or the second power line.

15 Claims, 10 Drawing Sheets

(56)                    References Cited

U.S. PATENT DOCUMENTS

| | | | | |
|---|---|---|---|---|
| 2005/0218959 A1* | 10/2005 | Yamawaki | ......... | H03K 19/0016 |
| | | | | 327/334 |
| 2005/0232053 A1* | 10/2005 | Azuma | .................. | G11C 5/147 |
| | | | | 365/226 |
| 2008/0205111 A1* | 8/2008 | Kajigaya | ................ | G11C 29/70 |
| | | | | 365/51 |
| 2020/0145599 A1* | 5/2020 | Matsuzaki | ......... | H10D 30/6734 |
| 2022/0223623 A1* | 7/2022 | Dia | ...................... | H10D 84/907 |
| 2022/0231053 A1* | 7/2022 | Takeno | ............... | H10D 84/907 |
| 2022/0253586 A1* | 8/2022 | Wang | ................... | G06F 30/394 |
| 2023/0299069 A1* | 9/2023 | Lu | ...................... | H10D 30/6219 |
| | | | | 257/369 |

FOREIGN PATENT DOCUMENTS

| | | | |
|---|---|---|---|
| CN | 114462349 A | 5/2022 |
| JP | H07135462 A | 5/1995 |
| JP | 2009272340 A | 11/2009 |
| JP | 2015015072 A | 1/2015 |

* cited by examiner

10′

LAYOUT STRUCTURE, SEMICONDUCTOR STRUCTURE AND MEMORY

CROSS-REFERENCE TO RELATED APPLICATIONS

This is a continuation of International Patent Application No. PCT/CN2022/126213 filed on Oct. 19, 2022, which claims priority to Chinese Patent Application No. 202211073818.7 filed on Sep. 2, 2022. The disclosures of the above-referenced applications are hereby incorporated by reference in their entirety.

BACKGROUND

Standard cell is the basis of integrated circuit design, which may include logic devices commonly used in integrated circuits, such as an inverter, a logic gate circuit, a register, a buffer. When designing an integrated circuit, a standard cell layout in a standard cell library may be called to complete the layout design of the integrated circuit according to the design requirements, which can improve the design efficiency of the circuit. With the high integration and high performance of the semiconductor devices, it is a feasible way to optimize the standard cells, so as to improve the design efficiency as well as the integration and performance of the semiconductor devices.

SUMMARY

The disclosure relates to the technical field of semiconductors, in particular to a layout structure, a semiconductor structure and a memory.

According to a first aspect of the disclosure, a semiconductor structure is provided. The semiconductor structure includes a logic device and a switch driving device.

The logic device includes a first power line and a second power line. The first power line and the second power line are located on a same wiring layer, each of the first power line and the second power line extends along a first direction, and the first power line and the second power line are arranged in parallel along a second direction. The first direction and the second direction intersect with each other and are both parallel to a plane where the wiring layer is located.

The switch driving device and the logic device are arranged in parallel along the first direction. The switch driving device includes a first input line and a first output line. The first input line, the first output line and the first power line are located on the same wiring layer, each of the first input line and the first output line extends along the first direction, and the first input line and the first output line are arranged in parallel along the second direction. The first output line is connected with the first power line or the second power line.

According to a second aspect of the disclosure, a memory is provided. The memory includes the semiconductor structure. The semiconductor structure includes a logic device and a switch driving device.

The logic device includes a first power line and a second power line. The first power line and the second power line are located on a same wiring layer, each of the first power line and the second power line extends along a first direction, and the first power line and the second power line are arranged in parallel along a second direction. The first direction and the second direction intersect with each other and are both parallel to a plane where the wiring layer is located.

The switch driving device and the logic device are arranged in parallel along the first direction. The switch driving device includes a first input line and a first output line. The first input line, the first output line and the first power line are located on the same wiring layer, each of the first input line and the first output line extends along the first direction, and the first input line and the first output line are arranged in parallel along the second direction. The first output line is connected with the first power line or the second power line.

According to a third aspect of the disclosure, a layout structure is provided. The layout structure includes a logic device layout and a switch driving device layout.

The logic device layout includes a first power line pattern and a second power line pattern. The first power line pattern and the second power line pattern are located on a same layout wiring layer. Each of the first power line pattern and the second power line pattern extends along a first direction, and the first power line pattern and the second power line pattern are arranged in parallel along a second direction. The first direction intersects with the second direction. The logic device layout is configured to define a logic device, the first power line pattern is configured to define a first power line, and the second power line pattern is configured to define a second power line.

The switch driving device layout and the logic device layout are arranged in parallel along the first direction. The switch driving device layout includes a first input line pattern and a first output line pattern. The first input line pattern, the first output line pattern and the first power line pattern are located on the same layout wiring layer. Each of the first input line pattern and the first output line pattern extends along the first direction, and the first input line pattern and the first output line pattern are arranged in parallel along the second direction. The first output line pattern extends along the first direction and is connected with the first power line pattern or the second power line pattern. The switch driving device layout is configured to define a switch driving device, the first input line pattern is configured to define a first input line, and the first output line pattern is configured to define a first output line.

DETAILED DESCRIPTION

Figure 1:
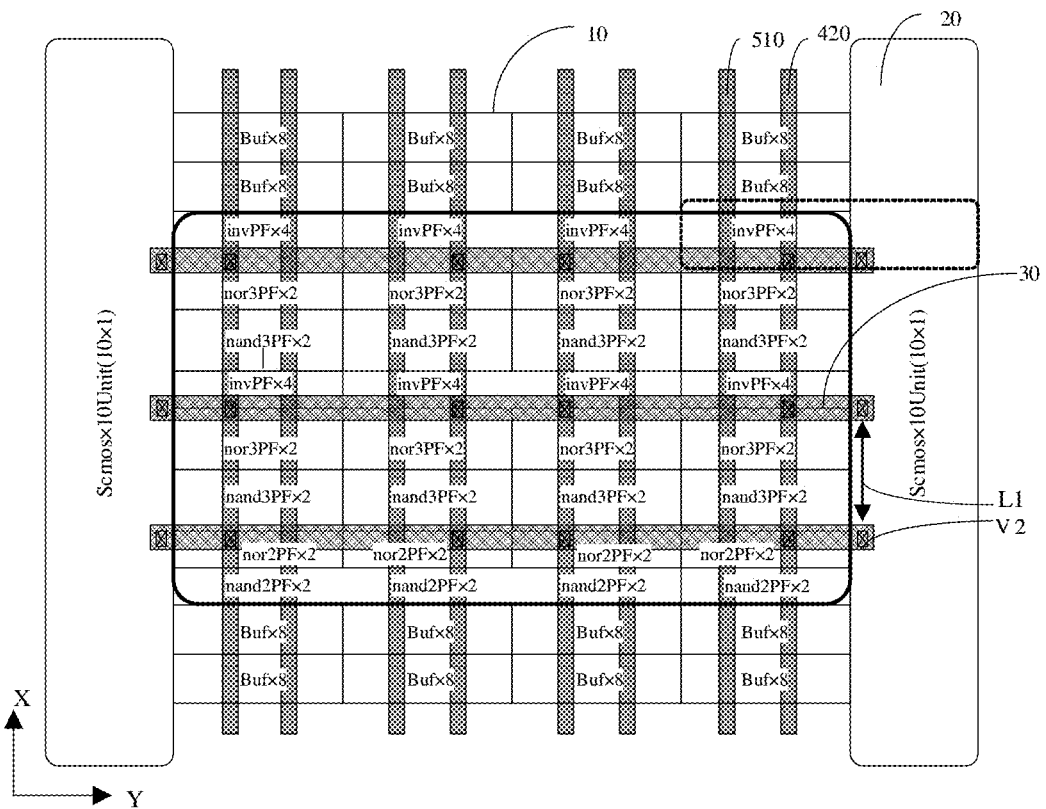
FIG. 1 is a schematic diagram of a layout of a semiconductor structure according to an embodiment of the disclosure.

The technical solution in the disclosure is described in detail below with reference to the accompanying drawings and specific embodiments in the specification.

In the description of the disclosure, it should be understood that terms "length", "width", "depth", "upper", "lower", "outer" and the like that indicate an orientation or positional relationship are based on the orientation or a positional relationship shown in the drawings, which are merely intended to facilitate the description of the disclosure and to simplify the description, rather than to indicate or imply that the referred device or element is limited to the specific orientation or to be operated or configured in the specific orientation. Therefore, the above-mentioned terms shall not be interpreted as confine to the disclosure.

FIG. 1 is a schematic diagram of a layout of a semiconductor structure according to an embodiment of the disclosure. The semiconductor structure includes a standard cell array 10. The standard cell array 10 includes a plurality of standard cells. For example, as shown in FIG. 1, the standard cell array includes 4×12 standard cells.

The standard cell may include different types of logic devices. The logic device may be a buffer (abbreviated as buf), a register, an inverter (abbreviated as inv), a logic gate circuit and the like. The logic gate circuit includes, but is not limited to a NOR gate circuit (nor), a NAND gate circuit (nand) and the like. It should be noted that there are expressions, such as nand3PF×2, shown in the figures, which will be defined uniformly herein, in which "nand" represents any logic gate circuit; "3" represents the number of the input terminals of the logic gate circuit; "PF" represents that the power supply terminal is not limited, and the grounding terminal is defined as the main grounding terminal Vss; "GF" represents that the grounding terminal is not limited, and the power supply terminal is defined as the main power supply terminal Vcc; and "×2" represents the width-to-length ratio of the MOS transistor in the logic gate circuit.

The semiconductor structure further includes two switch driving device arrays 20. The two switch driving device arrays 20 are respectively arranged on either side of the standard cell array 10 along a Y direction. The switch driving device array 20 includes a plurality of switch driving devices (Switch CMOS Driver Cell, abbreviated as Scmos Dry cell). For example, as shown in FIG. 1, the switch driving device array may include 10×1 switch driving devices, in which "10" represents the number of the switch driving devices, and "×1" represents the width-to-length ratio of the MOS transistor in the switch driving device.

The semiconductor structure further includes a plurality of local power buses 30, each local power bus 30 extending along the Y direction. The local power bus 30 electrically connects the switch driving device with the logic device.

The switch driving device is configured to control the turning on and turning off of the power supply of the logic device (i.e., the standard cell array). For example, the switch driving device includes a PMOS transistor (P-channel enhancement mode field effect transistor), an NMOS transistor (N-channel enhancement mode field effect transistor), or a CMOS circuit composed of a PMOS transistor and an NMOS transistor.

There are two connection modes of the switch driving device with the logic device. One is to turn off the logic device by turning off the power signal of the logic device, and the other is to turn off the logic device by turning off the grounding signal of the logic device.

Figure 2A:
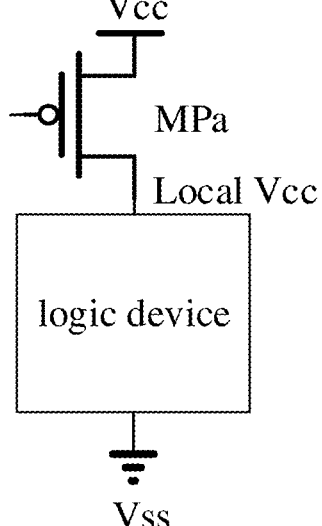
FIG. 2A is a schematic diagram of a circuit connection of a logic device and a switch driving device according to an embodiment of the disclosure.
Figure 2B:
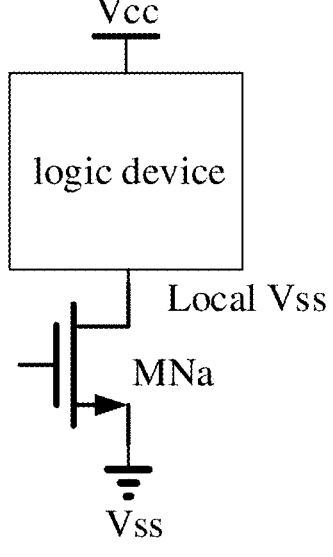
FIG. 2B is a schematic diagram of another circuit connection of a logic device and a switch driving device according to an embodiment of the disclosure.

FIG. 2A and FIG. 2B show two connection modes of the switch driving device with the logic device. As shown in FIG. 2A, the switch driving device is a PMOS transistor MPa. The drain of the PMOS transistor MPa is connected to the power supply Vcc, the source of the PMOS transistor MPa is connected to the power supply terminal of the logic device, and the grounding terminal of the logic device is connected to the common grounding Vss. When the PMOS transistor MPa is turned on, the switch driving device supplies power to the logic device. For example, the power supply provided by the switch driving device is referred to as the local power supply (Local Vcc). When the PMOS transistor MPa is turned off, the power supply of the logic device can be turned off.

As shown in FIG. 2B, the switch driving device is an NMOS transistor MNa. The drain of the NMOS transistor MNa is connected to the common grounding Vss, the source of the NMOS transistor MNa is connected to the grounding terminal of the logic device, and the power supply terminal of the logic device is connected to the power supply Vcc. When the NMOS transistor MNa is turned on, the switch driving device is configured to provide a grounding signal to the logic device. For example, the grounding signal provided by the switch driving device is referred to as the local grounding signal (Local Vss). When the NMOS transistor MNa is turned off, the power supply of the logic device can be turned off.

Combined with the above analysis, it should be noted that there are three modes to provide power to the logic devices. The first mode is that the power supply terminal is connected to the power supply Vcc, and the grounding terminal is connected to the common grounding Vss. The second mode is that the power supply terminal is connected to the switch driving device to receive the local power supply (Local Vcc), and the grounding terminal is connected to the common grounding Vss. The third mode is that the power supply terminal is connected to the power supply Vcc, and the grounding terminal is connected to the switch driving device to receive the local grounding signal (Local Vss).

Figure 3:
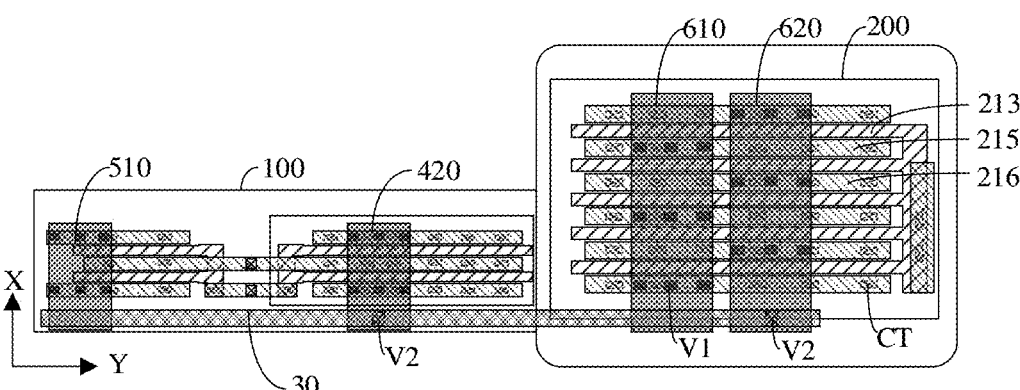
FIG. 3 is an enlarged schematic diagram of the logic device and the switch driving device in the semiconductor structure shown in FIG. 1.

FIG. 3 is an enlarged schematic diagram of the logic device and the switch driving device in the semiconductor structure shown in FIG. 1, that is, an enlarged schematic diagram showing an area indicated by the dashed line box in FIG. 1. Herein, the logic device 100 is the invPF×4. In this embodiment, the layout and connection mode of the logic device 100 and the switch driving device 200 are explained by taking the logic device being the invPF×4 as an example.

Figure 4:
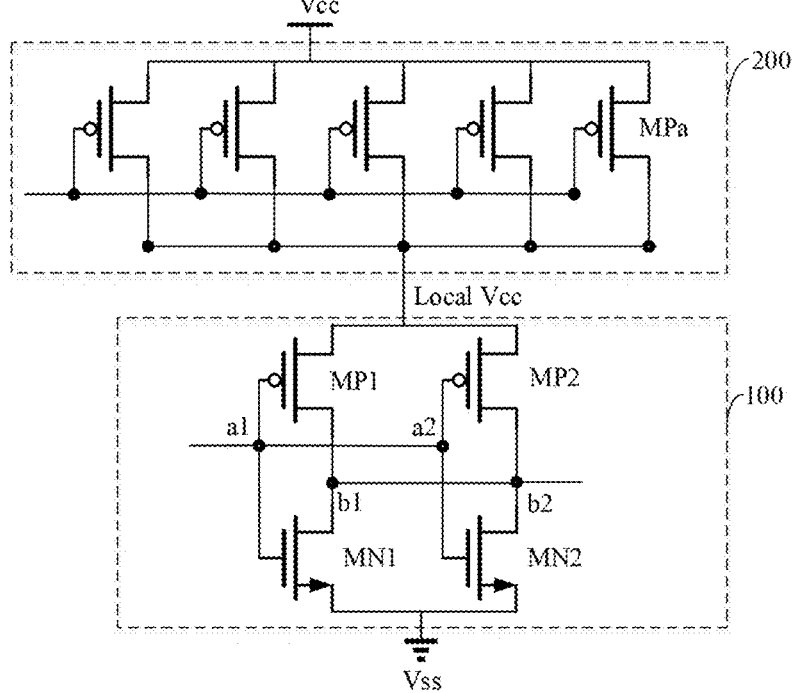
FIG. 4 is a circuit diagram of the logic device and the switch driving device shown in FIG. 3.

FIG. 4 is a circuit diagram of the logic device and the switch driving device shown in FIG. 3. As shown in FIG. 4, the switch driving device 200 includes a plurality of PMOS transistors MPa which are connected in parallel with each other. For example, in this embodiment, the switch driving device 200 includes five PMOS transistors MPa which are connected in parallel with each other. Thus, the switch driving device array 20 in FIG. 1 provides the local power supply (Local Vcc) to the standard cell array 10 through a plurality of local power buses 30. It should be understood that in some other embodiments, the switch driving device array may also provide the local grounding signal (Local Vss) to the standard cell array through a plurality of local power buses.

With reference to FIG. 4, the logic device 100 includes a first load transistor MP1, a first driving transistor MN1, a second load transistor MP2 and a second driving transistor MN2. The first load transistor MP1 and the second load transistor MP2 are PMOS transistors, and the first driving transistor MN1 and the second driving transistor MN2 are NMOS transistors.

The source of the first load transistor MP1 is connected to the output terminal of the switch driving device, for receiving the local power supply (Local Vcc), the drain of the first load transistor MP1 and the drain of the first driving transistor MN1 are both connected to the node b1, the source of the first driving transistor MN1 is connected to the common grounding Vss, and the gate of the first load transistor MP1 and the gate of the first driving transistor MN1 are both connected to the node a1. The source of the second load transistor MP2 is also connected to the output terminal of the switch driving device, for receiving the local power supply (Local Vcc), the drain of the second load transistor MP2 and the drain of the second driving transistor MN2 are both connected to the node b2, the source of the second driving transistor MN2 is connected to the common grounding Vss, and the gate of the second load transistor MP2 and the gate of the second driving transistor MN2 are both connected to the node a2. The node a1 is connected with the node a2, and the node b1 is connected with the node b2.

The logic device 100 includes two inverters connected in parallel with each other. The first load transistor MP1 and the first driving transistor MN1 constitute a first inverter, the node a1 is an input terminal of the first inverter, and the node b1 is an output terminal of the first inverter. The second load transistor MP2 and the second driving transistor MN2 constitute a second inverter, the node a2 is an input terminal of the second inverter, and the node b2 is an output terminal of the second inverter. The node a1 is connected to the node a2, and the node b1 is connected to the node b2, that is, the input terminal of the first inverter is connected to the input terminal of the second inverter, the output terminal of the first inverter is connected to the output terminal of the second inverter, and the first inverter and the second inverter are connected in parallel with each other.

Figure 5:
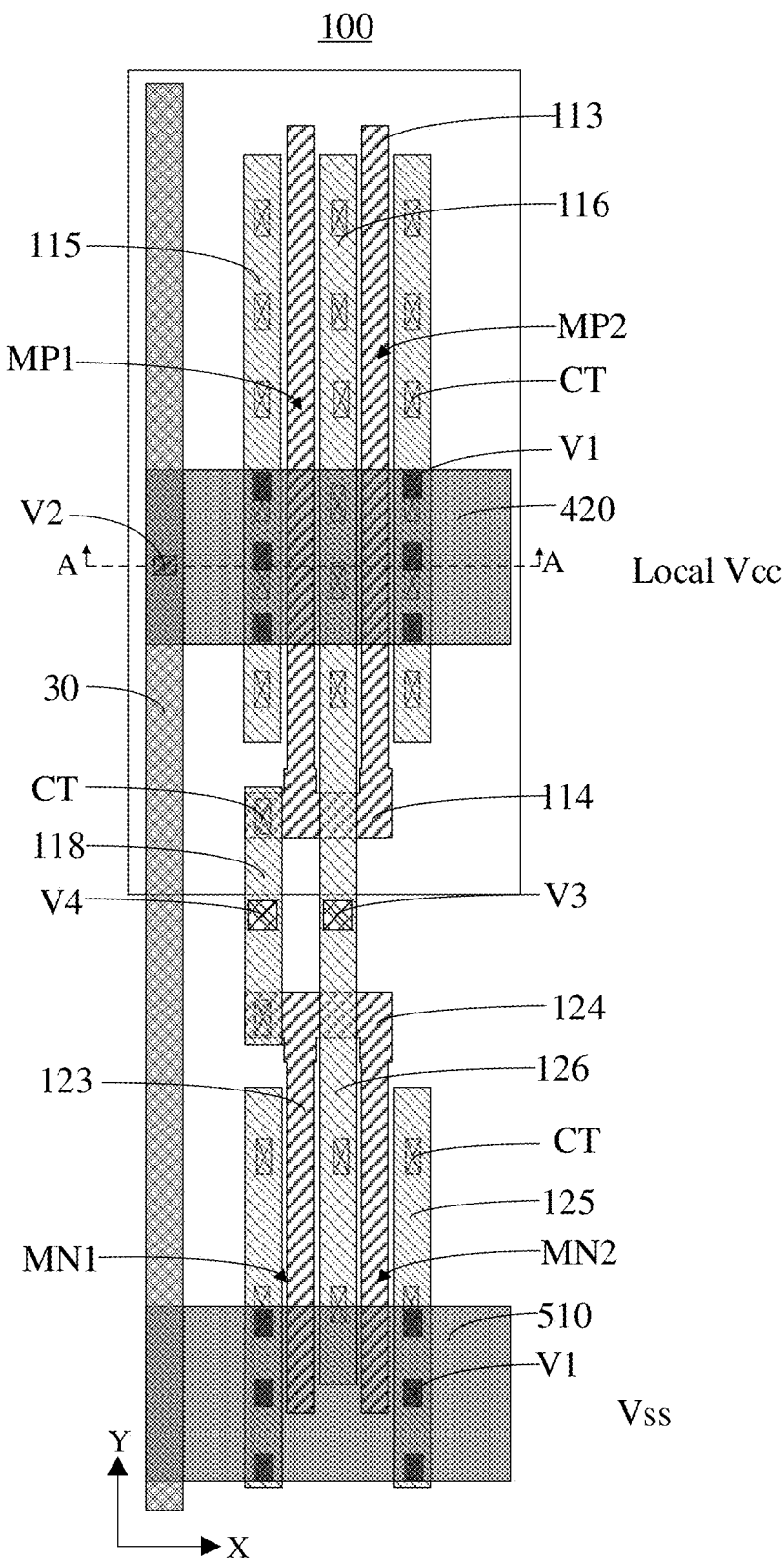
FIG. 5 is an enlarged schematic diagram of the logic device in FIG. 3.
Figure 6:
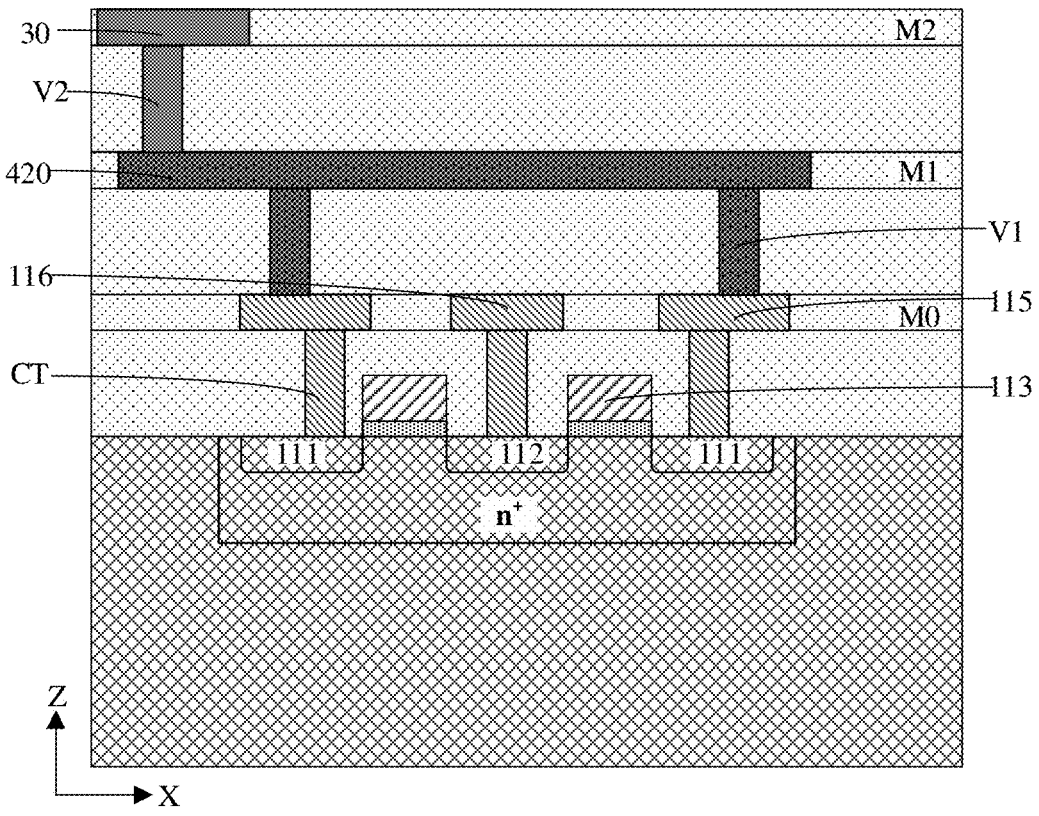
FIG. 6 is a cross-sectional diagram of the logic device taken along a line A-A in FIG. 5.

FIG. 5 is an enlarged schematic diagram of the logic device in FIG. 3. FIG. 6 is a cross-sectional diagram of the logic device taken along a line A-A in FIG. 5. With reference to FIG. 4 to FIG. 6, an n-type well region and a p-type well region are formed in a substrate. The first load transistor MP1 and the second load transistor MP2 are formed in the n-type well region, the first load transistor MP1 and the second load transistor MP2 are arranged in parallel along the X direction. The first driving transistor MN1 and the second driving transistor MN2 are formed in the p-type well region, the first driving transistor MN1 and the second driving transistor MN2 are arranged in parallel along the X direction. The first load transistor MP1 and the first driving transistor MN1 are arranged in parallel along the Y direction, and the second load transistor MP2 and the second driving transistor MN2 are arranged in parallel along the Y direction.

As shown in FIG. 6, each of the first load transistor MP1 and the second load transistor MP2 includes a source region 111 and a drain region 112 which are located in the n-type well region. Each of the source region 111 and the drain region 112 is a p-type doped region. The source region 111 and the drain region 112 are arrayed along the X direction and isolated from each other, and a channel is formed between the source region 111 and the drain region 112. In this embodiment, the first load transistor and the second load transistor share the drain region 112.

Each of the two load transistors (i.e., the first load transistor MP1 and the second load transistor MP2) also includes a gate structure covering the channel. The gate structure includes a gate 113 extending in the Y direction and a gate dielectric layer located between the gate 113 and the channel. The gates 113 of the two load transistors are arranged in parallel along the X direction and are electrically connected with each other through a sub-connecting line 114 extending in the X direction. The sub-connecting line 114 and the gate 113 are located on the same wiring layer.

Similarly, each of the first driving transistor MN1 and the second driving transistor MN2 includes a source region (not shown in the figure), a channel and a drain region (not shown in the figure) which are located in the p-type well region, as well as a gate structure covering the channel. The source region, the channel and the drain region are arranged in parallel along the X direction. Each of the source region and the drain region is an n-type doped region. The first driving transistor MN1 and the second driving transistor MN2 share a drain region. As shown in FIG. 5, the gate structure includes a gate 123 extending in the Y direction and a gate dielectric layer located between the gate 123 and the channel. The gates 123 of the two driving transistors (i.e., the first driving transistor MN1 and the second driving transistor MN2) are arranged in parallel along the X direction and are electrically connected with each other through a sub-connecting line 124 extending in the X direction. The sub-connecting line 124 and the gate 123 are located on the same wiring layer.

Herein, the gates 113 of the two load transistors and the gates 123 of the two driving transistors are located on the same wiring layer, but are isolated from each other, that is, the gates 113 and the gates 123 are not electrically connected with each other on this wiring layer.

With reference to FIG. 5 and FIG. 6, the logic device 100 further includes source lines 115 and drain line 116 of the two load transistors. Each of the source lines 115 and the drain line 116 of the two load transistors extends in the Y direction, each source line 115 is electrically connected to its source region through the contact plug CT, and each drain line 116 is electrically connected to its drain region through the contact plug CT. Herein, the source lines 115 and the drain line 116 of the two load transistors are defined to be located on a first wiring layer M0. The first wiring layer M0 is located above the wiring layer where the gate is located. The contact plug CT is located between the first wiring layer M0 and the substrate, or the contact plug CT is located between the first wiring layer M0 and the source region.

For example, the source line 115 of each load transistor may be electrically connected to its source region 111 through a respective contact plug CT, and the drain line 116 of each load transistor may be electrically connected to its drain region 112 through a respective contact plug CT.

Similarly, the logic device further includes source lines 125 and drain line 126 of the two driving transistors. Each of the source lines 125 and the drain line 126 of the two driving transistors extends in the Y direction. Each source line 125 is electrically connected to its source region through the contact plug CT, and each drain line 126 is electrically connected to its drain region through the contact plug CT. Herein, the source lines 125 and the drain line 126 of the two driving transistors are located on the first wiring layer M0.

Herein, in the first wiring layer M0, the drain line 116 shared by two load transistors is connected to the drain line 126 shared by two driving transistors. In other words, the drain line 116 and the drain line 126 constitute a single conductive line. The drain line 116 is connected to the drain line 126, and the node b1 and the node b2 in the corresponding circuit are connected to each other.

The first wiring layer M0 further includes a main connecting line 118 extending in the Y direction. The main connecting line 118 is electrically connected to the sub-connecting line 114 and the sub-connecting line 124 through the contact plug CT, and the node a1 and the node a2 in the corresponding circuit are connected to each other.

With reference to FIG. 5 and FIG. 6, the logic device further includes a first local line 420 and second main line 510. Herein, the first local line 420 is configured to provide the local power supply (Local Vcc) to the logic device, and the second main line 510 is configured to provide the common grounding signal Vss to the logic device. The first local line 420 and the second main line 510 both extend in the X direction and are arranged in parallel along the Y direction. The first local line 420 is electrically connected to the source lines 115 of the two load transistors through an interconnection via V1, and the second main line 510 is electrically connected to the source lines 125 of the two driving transistors through the interconnection via V1. Herein, the first local line 420 and the second main line 510 are located on a second wiring layer M1. The second wiring layer M1 is located above the first wiring layer M0. The interconnection via V1 is located between the second wiring layer M1 and the first wiring layer M0.

For example, the first local line 420 is electrically connected to the source lines 115 of the two load transistors through a plurality of interconnection vias V1, and the second main line 510 is electrically connected to the source lines 125 of the two driving transistors through a plurality of interconnection vias V1.

With reference to FIG. 5 and FIG. 6, the local power bus 30 is located on a third wiring layer M2. The third wiring layer M2 is located above the second wiring layer M1. The local power bus 30 is electrically connected to the first local line 420 of the logic device through an interconnection via V2. The interconnection via V2 is located between the third wiring layer M2 and the second wiring layer M1.

The logic device further includes an interconnection via V3 and an interconnection via V4. The interconnection via V3 is located on the drain line 116 and/or the drain line 126, for serving as the output terminal of the logic device, and the interconnection via V4 is located on the main connecting line 118, for serving as the input terminal of the logic device.

With reference to FIG. 3, the switch driving device 200 includes a plurality of PMOS transistors MPa connected in parallel with each other. The structure and layout of the PMOS transistor MPa are substantially the same as the structure and layout of the first load transistor MP1 and the second load transistor MP2 in the logic device. The PMOS transistor MPa includes: the first source region, the first channel, and the first drain region (not shown in the figure) which are located in the first well region of the substrate, as well as the first gate 213, the first source line 215, the first drain line 216, the first input line 610, and the first output line 620. The first well region is an n-type well region. The first source region, the first channel and the first drain region are arranged in parallel along the X direction. The first source region and the first drain region are p-type doped regions.

The first gate 213 covers the first channel and extends in the Y direction. The first source line 215 and the first drain line 216 are located on the first wiring layer M0, and the first source line 215 and the first drain line 216 extend along the Y direction and are arranged in parallel along the X direction. The first source line 215 is electrically connected to the first source region through the contact plug CT, and the first drain line 216 is electrically connected to the first drain region through the contact plug CT.

The first input line 610 and the first output line 620 are located on the second wiring layer M1. The first input line 610 and the first output line 620 extend along the X direction and are arranged in parallel along the Y direction. The first input line 610 is electrically connected to the first source line 215 through the interconnection via V1, and the first output line 620 is electrically connected to the first drain line 216 through the interconnection via V1.

The local power bus 30 is electrically connected to the first output line 620 through the interconnection via V2, such that the switch driving device provides the local power supply (Local Vcc) to the first local line 420 of the logic device.

When the semiconductor structure shown in FIG. 1 is applied to the circuit of Low Power Double Data Rate SDRAM (LPDDR), part of the logic devices (for example, the invPF×4, nor3PF×2, nand3PF×2, nor2PF×2, nand2PF×2 included in the solid line box in FIG. 1) may be composed of multiple high-speed transistors (abbreviated as Lvt transistor, Low V$_{th}$). The high-speed transistor has a low threshold voltage (V$_{th}$), a short delay time and a fast opening speed. However, the transistor noise of the high-speed transistor is easily superimposed, which leads to a poor stability of the delay time of the high-speed transistor. One feasible method is to improve the power supply stability of the high-speed transistors, that is, to improve the stability of the local power supply.

In some embodiments, the resistance value of the local power supply network may be reduced by increasing the number of the local power buses 30, or by increasing the line width of the local power bus 30, thereby improving the stability of the local power supply.

However, the above method has two disadvantages. The first disadvantage is that when the requirements for local power supply are extremely strict (such as double-edge handshake signal), even if the power is supplied to the standard cell array through all the local power buses 30, the resistance value of the local power supply network cannot be guaranteed to meet the requirements. The reason is that when the switch driving device provides the local power supply to the logic device, the flow path of the current is: the first drain line 216 of the switch driving device→the interconnection via V1→the first output line 620 of the switch driving device→the interconnection via V2→the local power bus 30→the interconnection via V2→the first local line 420 of the logic device→the interconnection via V1→the source line 115 of the logic device, that is, current sequentially flows through: M0→V1→M1→V2→M2→M1→V1→M0. Each of the interconnection via V1 and the interconnection via V2 is passed through twice in the transmission process. Due to the large resistance value of the interconnection via, the resistance value of the local power supply network is relatively large, the loss in the transmission process is relatively large, and the stability of the local signal is relatively poor.

The second disadvantage is that, even if the resistance value of the power supply network is reduced to the desired value by increasing the number of the local power buses 30 and increasing the line width of the local power bus 30, a large number of tracks of the third wiring layer M2 are occupied, resulting in insufficient tracks for subsequent layout arrangement.

Figure 7:
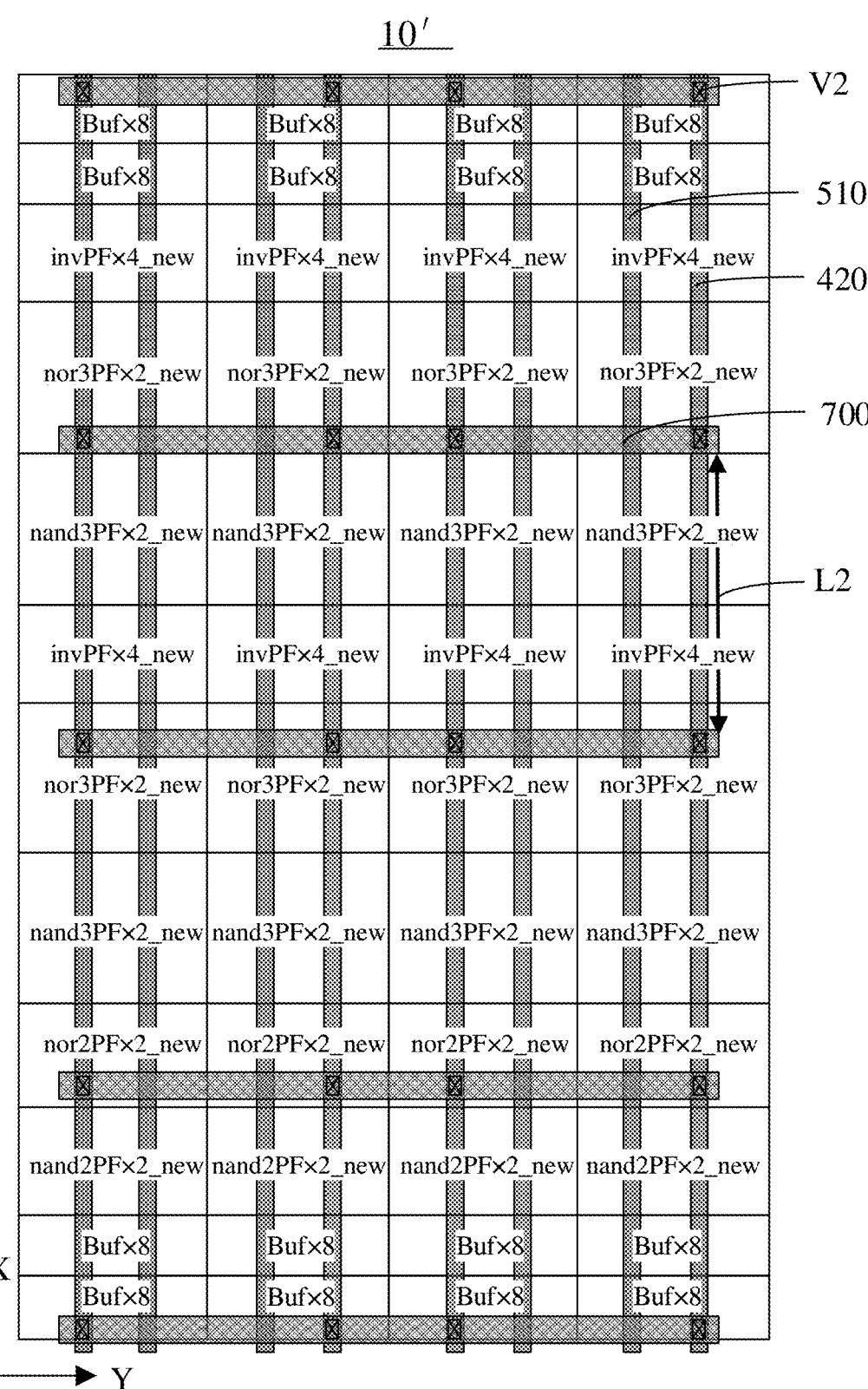
FIG. 7 is a schematic diagram of a layout of another semiconductor structure according to an embodiment of the disclosure.
Figure 8:
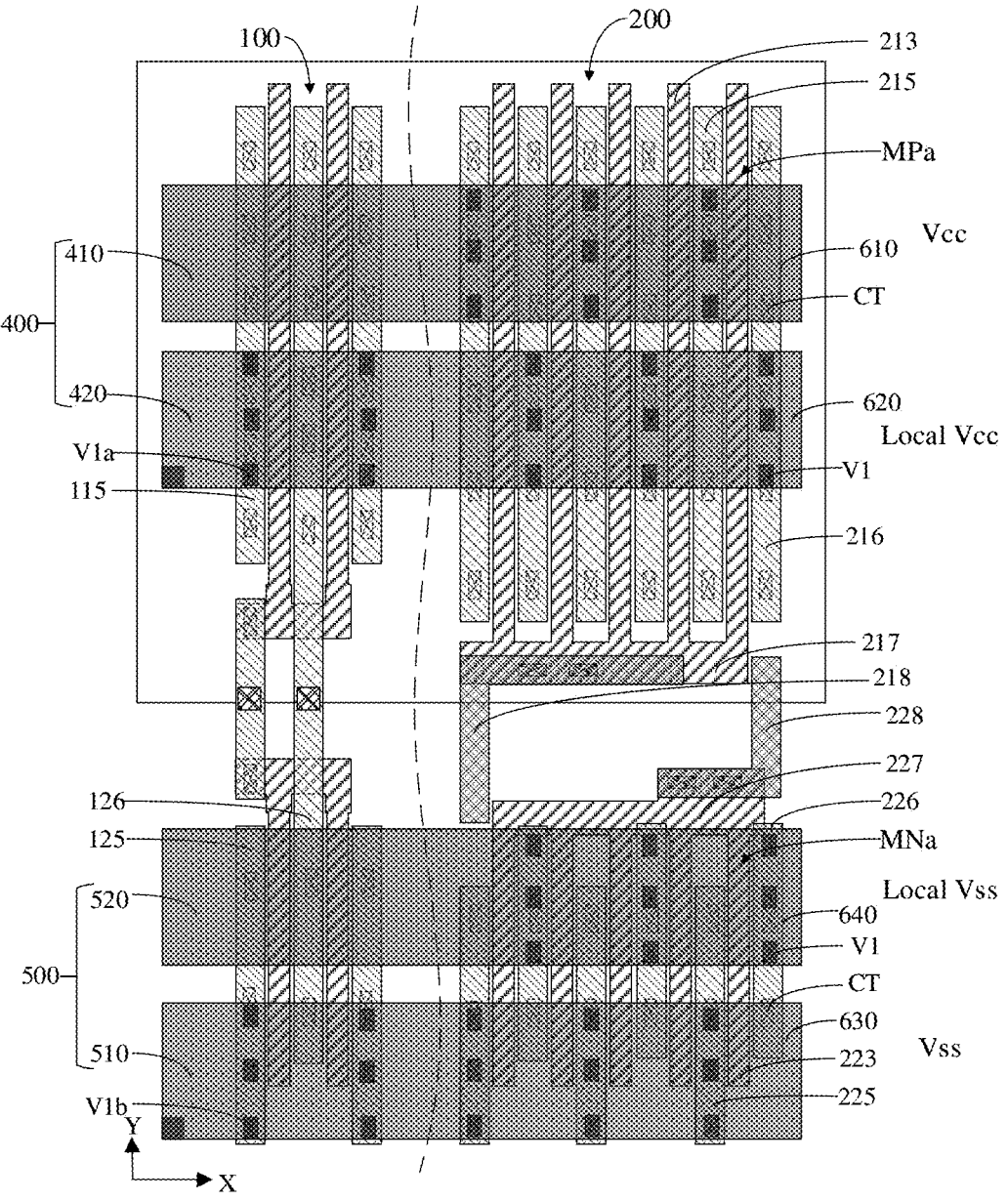
FIG. 8 is an enlarged schematic diagram of a standard cell in the semiconductor structure shown in FIG. 7.

In view of this, an embodiment of the disclosure provides a semiconductor structure. FIG. 7 is a schematic diagram of a semiconductor structure according to an embodiment of the disclosure. FIG. 8 is an enlarged schematic diagram of a standard cell in the semiconductor structure shown in FIG. 7. With reference to FIG. 7 and FIG. 8, the semiconductor structure includes a new standard cell array 10' including a plurality of standard cells. At least some of the standard cells include a logic device 100 and a switch driving device 200. In other words, in the embodiment of the disclosure, the switch driving device 200 and the logic device 100 are disposed in one standard cell, so as to form a logic device standard cell provided with a switch driving device.

The semiconductor structure shown in FIG. 7 includes an inverter standard cell invPF×4_new provided with a switch driving device, a NOR gate standard cell nor3PF×2_new provided with a switch driving device, a NOR gate standard cell nor2PF×2_new provided with a switch driving device, a NAND gate standard cell nand3PF×2_new provided with a switch driving device, and a NAND gate standard cell nand2PF×2_new provided with a switch driving device.

FIG. 8 shows an inverter standard cell invPF×4_new provided with a switch driving device. In this embodiment, the layout and connection mode of the logic device 100 and the switch driving device 200 in each of the standard cells are explained by taking the invPF×4_new as an example.

With reference to FIG. 8, the logic device 100 includes a first power line 400 and a second power line 500 which are located on the same wiring layer. The first power line 400 and the second power line 500 extend along a first direction (e.g. the X direction) and are arranged in parallel along a second direction (e.g. the Y direction). The first direction and the second direction intersect with each other and are both parallel to the plane where the wiring layer is located.

The switch driving device 200 and the logic device 100 are arranged in parallel along the X direction. The switch driving device 200 includes a first input line 610 and a first output line 620. The first input line 610, the first output line 620 and the first power line 400 are located on the same wiring layer. The first input line 610 and the first output line 620 both extend along the X direction and are arranged in parallel along the Y direction. The first output line 620 is connected with the first power line 400.

For example, the first power line 400 is configured to receive the power supply Vcc or the local power supply (Local Vcc), and the second power line 500 is configured to receive the common grounding signal Vss or the local grounding signal (Local Vss).

For example, the switch driving device 200 includes a PMOS transistor MPa including the first input line 610 and the first output line 620. The first output line 620 is connected to the first power line 400 of the logic device 100, and the switch driving device 200 provides the local power supply (Local Vcc) to the first power line 400 of the logic device 100. The second power line 500 of the logic device 100 is configured to receive the common grounding signal Vss.

Taking the standard cell shown in FIG. 8 as an example, in embodiments of the disclosure, the logic device 100 and the switch driving device 200 are arranged in parallel along the first direction, the first power line 400 and the second power line 500 of the logic device 100 extend along the first direction, and the first output line 620, the first power line 400 and the second power line 500 of the switch driving device 200 are all located on the same wiring layer (i.e., the second wiring layer M1), in which the first output line 620 is connected with the first power line 400. When the switch driving device 200 provides the local power supply to the logic device 100, the flow path of the current is: the first drain line 216 of the switch driving device 200→the interconnection via V1→the first output line 620 of the switch driving device 200→the first power line 400 of the logic device 100→the interconnection via V1→the source line 115 of the logic device 100, that is, current sequentially flows through: M0→V1→M1→V1→M0. Since the interconnection via V2 is not passed through in the transmission process, the resistance value of the local power supply network can be reduced, and the loss in the current transmission process can be reduced, thereby improving the stability of the local power supply of the logic device 100, and further improving the stability of the delay time of the logic device 100.

Further, the first power line 400 and the first output line 620 both extend in the X direction to be connected to each other, such that the first power line 400 and the first output line 620 are relatively short, which can further reduce the resistance value of the local network, thereby reducing the loss in the current transmission process.

In some embodiments, the first power line 400 includes a first main line 410 and a first local line 420. The first main line 410 and the first local line 420 are arranged in parallel along the Y direction. The first output line 620 is connected to the first local line 420, and the first input line 610 is connected to the first main line 410.

For example, the first main line 410 is configured to connect to the power supply Vcc, and the first local line 420 is configured to connect to the local power supply (Local Vcc).

It should be understood that the first input line 610 of the PMOS transistor MPa is configured to connect to the power supply Vcc, and the first main line 410 of the logic device 100 is configured to connect to the power supply Vcc, such that the first input line 610 may be connected to the first main line 410 to provide the power supply Vcc to the PMOS transistor MPa or to the logic device 100. The first output line 620 of the PMOS transistor MPa is connected to the first local line 420 of the logic device 100, such that the PMOS transistor MPa provides the local power supply (Local Vcc) to the logic device 100.

In some embodiments, the second power line 500 includes a second main line 510 and a second local line 520. The second main line 510 and the second local line 520 are arranged in parallel along the Y direction.

The switch driving device 200 further includes an NMOS transistor MNa including a second input line 630 and a second output line 640. The second input line 630, the second output line 640 and the second power line 500 are located on the same wiring layer, that is, located on the second wiring layer M1. The second input line 630 and the second output line 640 extend along the X direction and are arranged in parallel along the Y direction. The second input line 630 is connected to the second main line 510, and the second output line 640 is connected to the second local line 520.

For example, the second main line 510 is configured to connect to the common grounding Vss, and the second local line 520 is configured to connect to the local grounding (Local Vss).

It should be understood that the second input line 630 of the NMOS transistor MNa is configured to connect to the common grounding Vss, and the second main line 510 of the logic device 100 is configured to connect to the common grounding Vss, such that the second input line 630 may be connected to the second main line 510 to provide the common grounding Vss to the NMOS transistor MNa or to the logic device 100. The second output line 640 of the NMOS transistor MNa is connected to the second local line 520 of the logic device 100, such that the NMOS transistor MNa provides the local grounding signal (Local Vss) to the logic device 100.

In summary, in this embodiment, the logic device 100 includes the first main line 410, the first local line 420, the second main line 510 and the second local line 520 which are arranged in parallel along the Y direction, and the switch driving device 200 includes the first input line 610, the first output line 620 and the second input line 630 and the second output line 640 which are arranged in parallel along the Y direction. The first main line 410 is connected to the first input line 610, the first local line 420 is connected to the first output line 620, the second main line 510 is connected to the second input line 630, and the second local line 520 is connected to the second output line 640.

According to the circuit supply mode of the logic device 100 described above, in some embodiments, the first local line 420 may be electrically connected to the source lines 115 of the two load transistors through the first interconnection via V1*a*, and the second main line 510 may be electrically connected to the source lines 125 of the two driving transistors through the second interconnection via V1*b*, so as to supply the local power supply (Local Vcc) to the sources of the two load transistors, and to supply the common grounding signal Vss to the sources of the two driving transistors.

In some other embodiments, the first main line 410 may be connected to the source lines 115 of the two load transistors through a third interconnection via (not shown in the figure), and the second local line 520 may be electrically connected to the source lines 125 of the two driving transistors through a fourth interconnection via (not shown in the figure), so as to provide the power supply Vcc to the sources of the two load transistors, and to provide the local grounding signal (Local Vss) to the sources of the two driving transistors.

In some other embodiments, the first main line 410 may also be electrically connected to the source lines 115 of the two load transistors through the third interconnection via, and the second main line 510 may be electrically connected to the source lines 125 of the two driving transistors through the second interconnection via V1*b*, so as to provide the power supply Vcc to the sources of the two load transistors, and to provide the common grounding signal Vss to the sources of the two driving transistors.

Herein, the interconnection via V1 includes the first interconnection via V1*a*, the second interconnection via V1*b*, the third interconnection via and the fourth interconnection via, that is, the first interconnection via V1*a*, the second interconnection via V1*b*, the third interconnection via and the fourth interconnection via are all located between the second wiring layer M1 and the first wiring layer M0.

It should be understood that the first main line 410 and the first local line 420 cannot be electrically connected to the source lines 115 of the two load transistors at the same time, but only one of the first main line 410 and the first local line 420 may be connected to the source line 115. The second main line 510 and the second local line 520 cannot be electrically connected to the source lines 125 of the two driving transistors at the same time, but only one of the second main line 510 and the second local line 520 may be connected to the source line 125.

In summary, the standard cell provided by embodiments of the disclosure may be provided with the first interconnection via V1*a* and the second interconnection via V1*b*, or the third interconnection via and the fourth interconnection via, or the third interconnection via and the second interconnection via V1*b* according to requirements, so as to provide three kinds of power supplies to the logic device 100. The standard cell has a wide range of applications and may provide different power supplies to a variety of logic devices 100.

It should be noted that in the embodiment shown in FIG. 8, the switch driving device 200 includes a PMOS transistor and an NMOS transistor. In some other embodiments, the switch driving device may only include a PMOS transistor for providing the local power supply (Local Vcc) to the logic device. In some other embodiments, the switch driving device may only include an NMOS transistor, the first output line of the switch driving device may be connected to the second power line, so that the switch driving device provides the local grounding signal (Local Vss) to the second power line of the logic device, and the first power line of the logic device is configured to receive the power supply Vcc.

In some embodiments, the line width of the first output line 620 along the Y direction is equal to the line width of the first local line 420 along the Y direction, the line width of the first input line 610 along the Y direction is equal to the line width of the first main line 410 along the Y direction, the line width of the second output line 640 along the Y direction is equal to the line width of the second local line 520 along the Y direction, and the line width of the second input line 630 along the Y direction is equal to the line width of the second main line 510 along the Y direction.

In other words, the first output line 620 and the first local line 420 are actually one single conductive line, and the second output line 640 and the second local line 520 are one single conductive line, the second input line 630 and the second main line 510 are one single conductive line, and the second output line 640 and the second local line 520 are one single conductive line. The second wiring layer includes four conductive lines arranged in parallel along the Y direction. This arrangement can make the standard cells more regular, which is beneficial to improve the layout efficiency of the semiconductor structure.

Figure 9:
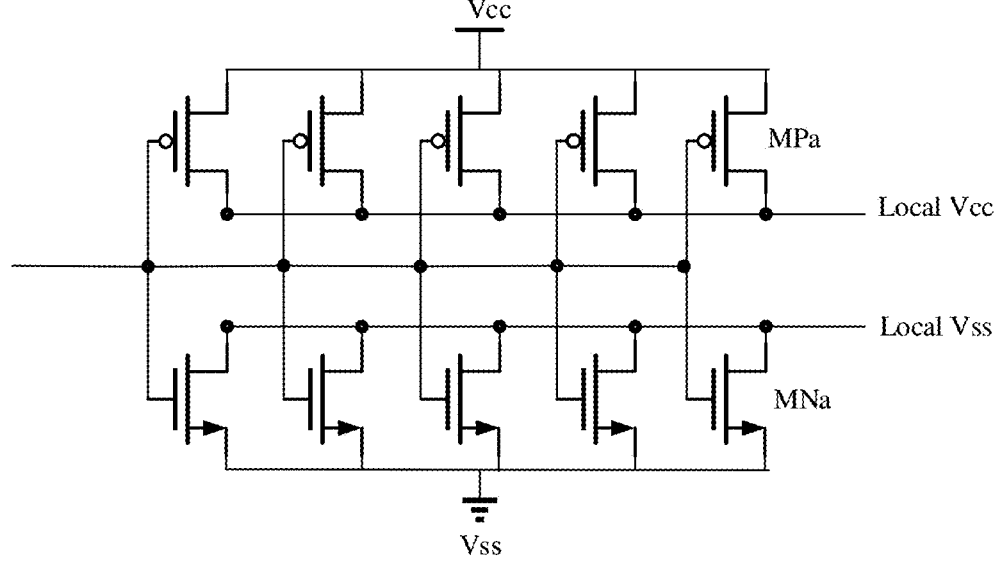
FIG. 9 is a circuit diagram of a switch driving device in the standard cell shown in FIG. 8.

FIG. 9 is a circuit diagram of a switch driving device in the standard cell shown in FIG. 8. With reference to FIG. 8 and FIG. 9, in this embodiment, the switch driving device 200 includes a plurality of PMOS transistors MPa connected in parallel with each other and a plurality of NMOS transistors MNa connected in parallel with each other. In the plurality of PMOS transistors MPa connected in parallel with each other, the source of each PMOS transistor MPa is connected to the power supply Vcc, the drains are connected to each other for outputting the local power supply (Local Vcc), and the gates are connected to each other, such that the plurality of PMOS transistors MPa connected in parallel with each other are turned on at the same time. In the plurality of NMOS transistors MNa connected in parallel with each other, the source of each NMOS transistor MNa is connected to a common grounding Vss, the drains are connected to each other for outputting the local common grounding signal (Local Vss), and the gates are connected to each other, such that the plurality of NMOS transistors MNa connected in parallel with each other are turned on at the same time.

In this embodiment, the plurality of PMOS transistors MPa connected in parallel with each other and the plurality of NMOS transistors MNa connected in parallel with each other may improve the driving capability of the switch driving device 200, so as to meet the power consumption requirements of the logic device 100.

As described above, the structure of the PMOS transistor MPa is basically the same as the structure of the first load transistor MP1 and the second load transistor MP2 in the logic device 100, which is not repeated herein.

It should be noted that when a plurality of PMOS transistors MPa are connected in parallel with each other, as shown in FIG. 8, the first well region includes a plurality of first source regions and a plurality of first drain regions, the first source regions and the first drain regions are alternately arranged along the X direction, each of the first source regions is provided with a first source line 215, each of the first drain regions is provided with a first drain line 216, and the plurality of first source lines 215 and the plurality of first drain lines 216 are alternately arranged along the X direction on the first wiring layer M0.

A first channel is arranged between the first source region and the first drain region which are arranged adjacent to each other in the first well region. Each first channel is provided with a first gate 213, and a plurality of first gates 213 are arranged in parallel along the X direction and are connected with each other.

Herein, each of the PMOS transistors MPa includes a first gate 213, and a first source region and a first drain region. The first source region is positioned on one side of the first gate 213, and the first drain region is positioned on the other side of the first gate 213. Two adjacent PMOS transistors MPa share a first source region or a first drain region.

The first input line 610 is electrically connected to a plurality of first source lines 215 through the interconnection via V1, and the sources of the plurality of PMOS transistors MPa in the corresponding circuit are all connected to Vcc. The first output line 620 is electrically connected to a plurality of first drain lines 216 through the interconnection via V1, and the drains of the plurality of PMOS transistors MPa in the corresponding circuit are connected to each other for outputting the local power supply (Local Vcc).

In addition, the structure of the NMOS transistor MNa is substantially the same as the structure of the first driving transistor MN1 and the second driving transistor MN2 in the logic device 100. As shown in FIG. 8, each of the NMOS transistors MNa further includes: a second source region, a second channel and a second drain region (not shown in the figure) which are located in a second well region of the substrate, as well as a second gate 223, a second source line 225 and a second drain line 226. The second well region is a p-type well region, the second source region, the second channel and the second drain region are arranged in parallel along the X direction, and each of the second source region and the second drain region is an n-type doped region.

The second gate 223 covers the second channel and extends in the Y direction. The second source line 225 and the second drain line 226 are located on the first wiring layer M0, and the second source line 225 and the second drain line 226 extend along the Y direction and are arranged in parallel along the X direction. The second source line 225 is electrically connected to the second source region through the contact plug CT, and the second drain line 226 is electrically connected to the second drain region through the contact plug CT.

The second input line 630 and the second output line 640 are located on the second wiring layer M1, the second input line 630 is electrically connected to the second source line 225 through the interconnection via V1, and the second output line 640 is electrically connected to the second drain line 226 through the interconnection via V1.

When a plurality of NMOS transistors MNa are connected in parallel with each other, as shown in FIG. 8, the second well region includes a plurality of second source regions and a plurality of second drain regions. The second source regions and the second drain regions are alternately arranged along the X direction. Each of the second source regions is provided with a second source line 225, each of the second drain regions is provided with a second drain line 226, and the plurality of second source lines 225 and the plurality of second drain lines 226 are alternately arranged along the X direction on the first wiring layer M0.

A second channel is arranged between the second source region and the second drain region which are arranged adjacent to each other in the second well region. Each second channel is provided with a second gate 223, and a plurality of second gates 223 are arranged in parallel along the X direction and are connected with each other.

Herein, each of the NMOS transistors MNa includes a second gate 223, and a second source region and a second drain region. The second source region is positioned on one side of the second gate 223, and the second drain region is positioned on the other side of the second gate 223. Two adjacent NMOS transistors MNa share a second source region or a second drain region.

The second input line 630 is electrically connected to a plurality of second source lines 225 through the interconnection via V1, and the sources of the plurality of NMOS transistors MNa in the corresponding circuit are all connected to Vss. The second output line 640 is electrically connected to a plurality of second drain lines 226 through the interconnection via V1, and the drains of the plurality of NMOS transistors MNa in the corresponding circuit are connected to each other for outputting the local grounding signal (Local Vss).

Figure 11:
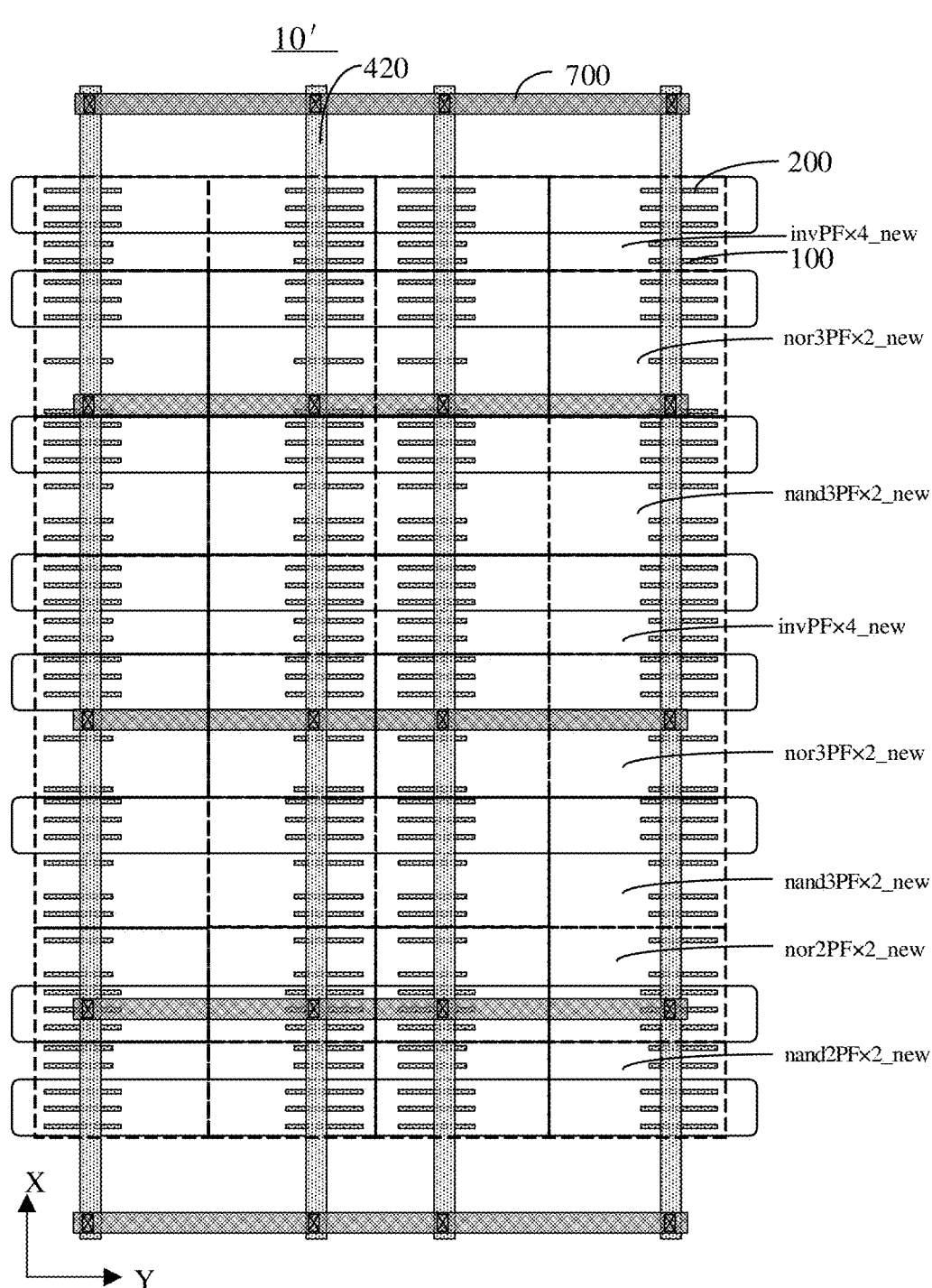
FIG. 11 is a schematic diagram of a current path of the semiconductor structure shown in FIG. 7 in an operating state.

Further, with reference to FIG. 11, the first gate 213 of the PMOS transistor MPa is connected to the second gate 223 of the NMOS transistor MNa. It should be understood that the PMOS transistor MPa is turned on at a low level and turned off at a high level, while the NMOS transistor MNa is turned on at a high level and turned off at a low level. In this embodiment, the first gate 213 of the PMOS transistor MPa is connected to the second gate 223 of the NMOS transistor MNa, when a high level is applied to the gates of the PMOS transistor MPa and the NMOS transistor MNa, the NMOS transistor MNa is turned on and the PMOS transistor MPa is turned off, such that the local grounding signal (Local Vss) may be supplied to the logic device 100; when a low level is applied, the PMOS transistor MPa is turned on and the NMOS transistor MNa is turned off, such that the local power supply (Local Vss) may be supplied to the logic device 100.

It should be noted that in some other embodiments, the first gate 213 of the PMOS transistor MPa and the second gate 223 of the NMOS transistor MNa may be independently controlled without being connected to each other. However, in this embodiment, the first gate 213 of the PMOS transistor MPa is connected to the second gate 223 of the NMOS transistor MNa. On the one hand, the situation that the local power supply (Local Vcc) and the local grounding signal (Local Vss) are simultaneously supplied to the logic device 100 can be avoided. On the other hand, the operation is simpler, and the local power supply (Local Vcc) or the local grounding signal (Local Vss) can be output only by changing the level.

In order to realize the connection between the first gate 213 of the PMOS transistor MPa and the second gate 223 of the NMOS transistor MNa, in terms of layout, the switch driving device 200 further includes: a first gate connecting line 217, a second gate connecting line 227, a first auxiliary connecting line 218, a second auxiliary connecting line 228, and a gate control line.

The first gate connecting line 217 and the first gate 213 are located on the same wiring layer. The first gate connecting line 217 extends along the X direction and is connected to the ends of the plurality of first gates 213 closer to the second gate 223.

The second gate connecting line 227 and the second gate 223 are located on the same wiring layer. The second gate connecting line 227 extends along the X direction and is connected to the ends of the plurality of second gates 223 closer to the first gate 213.

The first auxiliary connecting line 218 is located on the first wiring layer M0. The first auxiliary connecting line 218 includes a first portion extending along the X direction and a second portion extending along the Y direction. The first portion is electrically connected to the first gate connecting line 217 through the contact plug CT.

The second auxiliary connecting line 228 is located on the first wiring layer M0. The second auxiliary connecting line 228 includes a third portion extending along the X direction and a fourth portion extending along the Y direction. The third portion is electrically connected to the second gate connecting line 227 through the contact plug CT. An orthographic projection of the second portion at least partially overlaps with an orthographic projection of the fourth portion in a plane perpendicular to the X direction.

The gate control line (not shown in the figure) extends along the X direction and electrically connected to the second portion and the fourth portion. In some embodiments, the gate control line is located on the first wiring layer M0. Since the orthographic projection of the second portion at least partially overlaps with the orthographic projection of the fourth portion in the plane perpendicular to the X direction, the second portion may be connected to the fourth portion by providing the gate control line, which extends along the X direction, in the second wiring layer, so as to control the turning on of the PMOS transistor MPa or the NMOS transistor MNa by inputting a low level or a high level to the gate control line, thereby realizing the output of the local power supply (Local Vcc) or the local grounding signal (Local Vss).

In some other embodiments, the gate control line may also be located on the second wiring layer M1, so as to be electrically connected to the second portion and the fourth portion through the interconnection via V1.

It should be understood that the nor3PF×2_new, nor2PF×2_new, nand3PF×2_new and nand2PF×2_new shown in FIG. 7 are composed of the nor3PF nor2PF×2, nand3PF×2, nand2PF×2 and the switch driving devices, respectively. The nor3PF×2, nor2PF×2, nand3PF×2, nand2PF×2 are basically composed of the PMOS transistors and the NMOS transistors. Therefore, the layout modes of the NOR gate circuits nor3PF×2, nor2PF×2 and NAND gate circuits nand3PF×2, nand2PF×2 can be reasonably deduced according to the layout mode of the inverter invPF×4 provided by this embodiment, thereby reasonably deducing the layout modes of the nor3PF×2_new, nor2PF×2_new, nand3PF×2_new and nand2PF×2_new, which are not repeated in the disclosure.

It should be noted that the above logic device generally includes a first component and a second component which are arranged in parallel along the Y direction. For example, the first component includes a plurality of PMOS transistors, and the second component includes a plurality of NMOS transistors. The first component is provided with a first power lead-out line located on the first wiring layer. For example, the first power lead-out line is a source line of the PMOS transistor (e.g. the source line 115 of the first load transistor MP1 and the second load transistor MP2). The second component is provided with a second power lead-out line located on the first wiring layer. For example, the second power lead-out line is a source line of the NMOS transistor (e.g. the source line 125 of the first driving transistor MN1 and the second driving transistor MN2). The first local line is electrically connected with the first power lead-out line through the first interconnection via, and the second main line is electrically connected with the second power lead-out line through the second interconnection via. Alternatively, the first main line is electrically connected with the first power lead-out line through the third interconnection via, and the second local line is electrically connected with the second power lead-out line through the fourth interconnection via.

It should be noted that the switch driving devices of different logic devices may be different. In some embodiments, the dimension of the corresponding switch driving device (e.g., the number of PMOS transistors and NMOS transistors in the switch driving device) can be obtained according to the driving requirements of the logic device, and thereby integrating the logic device and its corresponding switch driving device into a standard cell.

In the standard cell array 10', the first input line, the first output line, the second input line and the second output line of the standard cell are respectively connected with the first main line, the first local line, the second main line and the second local line of another standard cell which is arranged adjacent to said standard cell along the X direction. The first local line 420 and the second main line 510 are shown in FIG. 7. In other words, a plurality of standard cells arranged in parallel along the X direction share four conductive lines arranged in parallel along the Y direction. Each conductive line extends along the X direction, and the four conductive lines are respectively configured to output the power supply Vcc, the local power supply (Local Vcc), the common grounding signal Vss, and the local grounding signal (Local Vss).

The semiconductor structure further includes a power connecting line 700 located on the third wiring layer M2. The power connecting line 700 extends along the Y direction and is connected to the first local line 420 or the first output line of each of the plurality of standard cells, the plurality of standard cells being arranged in parallel along the Y direction.

The power connecting line 700 connects the first local lines 420 of the plurality of standard cells arranged in parallel along the Y direction in parallel with each other, so as to form a parallel branch, for balancing the driving capability of each of the standard cells. Although the power connecting line 700 and the local power bus 30 in FIG. 1 are both located on the third wiring layer M2, their functions are different. The local power bus 30 is configured to supply the local power supply to the standard cell array, which has a relatively large driving capability, relatively large power consumption and a relatively large line width. However, the power connecting line 700 in FIG. 7 only serves as a parallel branch, such that the line width of the power connecting line 700 is smaller, and the number of the power connecting line 700 may also be less, thereby saving the tracks of the third wiring layer M2.

By comparing FIG. 1 with FIG. 7, it can be known that the pitch L2 of two adjacent power connecting lines 700 in the third wiring layer M2 along the X direction shown in FIG. 7 is much larger than the pitch L1 of two adjacent local power buses 30 in the third wiring layer M2 along the X direction shown in FIG. 1. The pitch L2 is almost twice the pitch L1, thereby saving the tracks of the third wiring layer M2. Moreover, the new standard cell array is more regular and easier to lay out.

Figure 10:
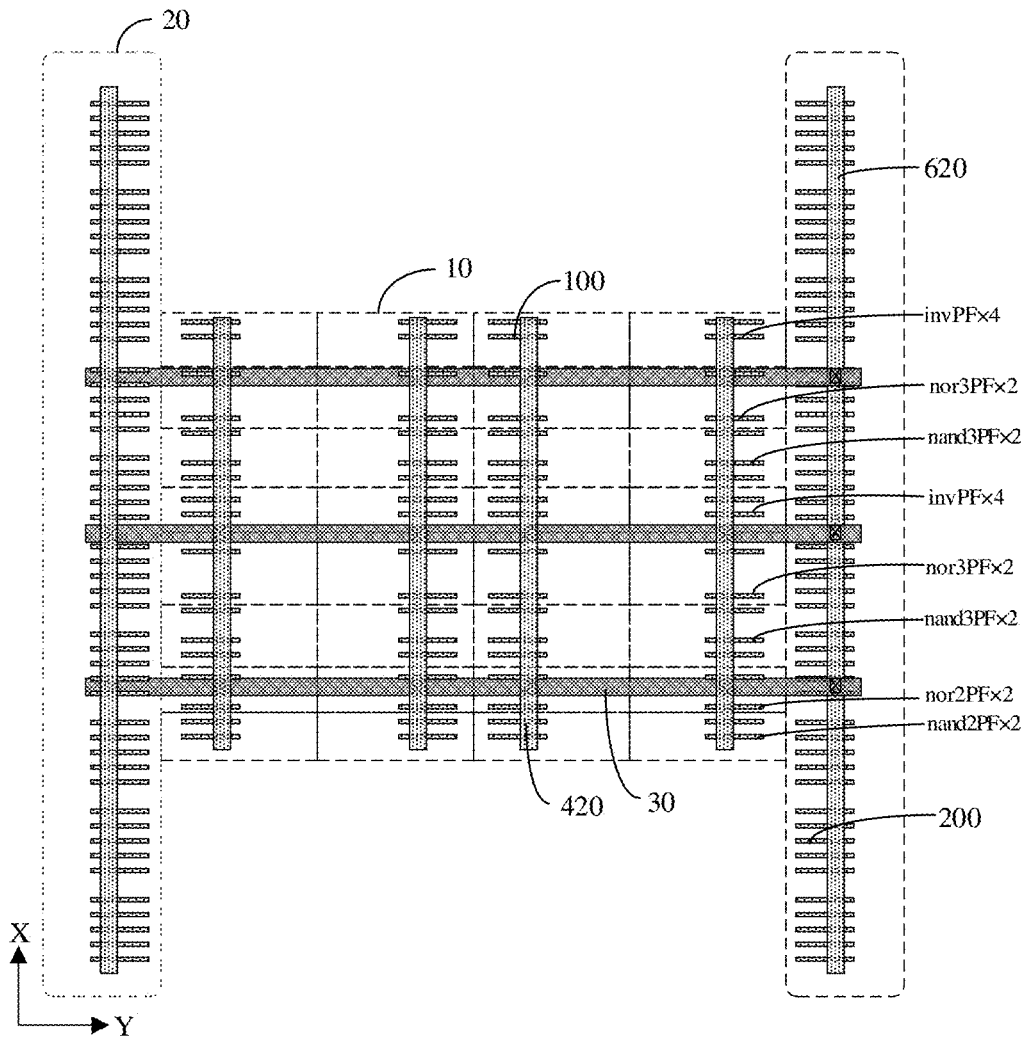
FIG. 10 is a schematic diagram of a current path of the semiconductor structure shown in FIG. 1 in an operating state.

FIG. 10 is a schematic diagram of a current path of the semiconductor structure shown in FIG. 1 in an operating state. FIG. 11 is a schematic diagram of a current path of the semiconductor structure shown in FIG. 7 in an operating state. The gray area in this figure is the position where the switch driving device 200 is located. By comparing FIG. 11 with FIG. 10, it can be known that in the semiconductor structure provided by embodiments of the disclosure, the switch driving devices 200 and the logic devices 100 are alternately arranged along the X direction. The distance between the switch driving device 200 and the logic device 100 is smaller, and the current transmission path is shorter, which is almost the shortest, such that the resistance of the local power supply network can be greatly reduced, and the stability of the local power supply can be improved.

In addition, according to the measured data, the resistance values of the second wiring layer M1 and the third wiring layer M2 in the local power supply network shown in FIG. 10 mostly range from 2 ohm to 4 ohm, some areas even range from 4 ohm to 5 ohm. The resistance values of the second wiring layer M1 and the third wiring layer M2 in the local power supply network shown in FIG. 11 mostly range from 1.3 ohm to 2 ohm, part of them range from 2 ohm to 3.3 ohm. It can be seen that the resistance value of the local power supply network of the semiconductor structure shown in FIG. 7 is obviously superior to that of the semiconductor structure shown in FIG. 1. Thus, the semiconductor structure provided by the embodiment of the disclosure can reduce the resistance of the local power supply network, and improve the stability of the local power supply.

The disclosure further provides a memory, which includes the semiconductor structure described above.

For example, this memory may be a Dynamic Random Access Memory (DRAM), a Static Random Access Memory (SRAM), a three-dimensional NAND flash memory, a two-dimensional NAND flash memory, a phase change memory, and the like.

An embodiment of the disclosure further provides a layout structure configured to prepare the semiconductor structure described above. The layout structure includes a logic device layout, and a switch driving device layout.

The logic device layout includes a first power line pattern and a second power line pattern. The first power line pattern and the second power line pattern are located on a same layout wiring layer. Each of the first power line pattern and the second power line pattern extends along a first direction, and the first power line pattern and the second power line pattern are arranged in parallel along a second direction. The first direction intersects with the second direction. The logic device layout is configured to define a logic device, the first power line pattern is configured to define a first power line, and the second power line pattern is configured to define a second power line.

The switch driving device layout and the logic device layout are arranged in parallel along the first direction. The switch driving device layout includes a first input line pattern and a first output line pattern. The first input line pattern, the first output line pattern and the first power line pattern are located on the same layout wiring layer. Each of the first input line pattern and the first output line pattern extends along the first direction, and the first input line pattern and the first output line pattern are arranged in parallel along the second direction. The first output line pattern extends along the first direction and is connected with the first power line pattern or the second power line pattern. The switch driving device layout is configured to define a switch driving device, the first input line pattern is configured to define a first input line, and the first output line pattern is configured to define a first output line.

In some embodiments, the layout structure includes a standard cell layout. The standard cell layout includes the logic device layout and the switch driving device layout, and the standard cell layout is configured to define the above standard cell.

In some embodiments, the first power line pattern includes a first main line pattern and a first local line pattern, which are arranged in parallel along the second direction. The first main line pattern is configured to define a first main line, and the first local line pattern is configured to define a first local line.

The first output line pattern is connected with the first local line pattern, and the first input line pattern is connected with the first main line pattern.

In some embodiments, the second power line pattern includes a second main line pattern and a second local line pattern, which are arranged in parallel along the second direction. The second main line pattern is configured to define a second main line, and the second local line pattern is configured to define a second local line.

The switch driving device layout further includes: a second input line pattern and a second output line pattern. The second input line pattern, the second output line pattern and the second power line pattern are located on the same layout wiring layer. Each of the second input line pattern and the second output line pattern extends along the first direction, and the second input line pattern and the second output line pattern are arranged in parallel along the second direction. The second output line pattern is connected with the second local line pattern, and the second input line pattern is connected with the second main line pattern. The second input line pattern is configured to define a second input line, and the second output line pattern is configured to define a second output line.

In some embodiments, the logic device layout further includes: a first component layout and a second component layout which are arranged in parallel along the second direction. The first component layout is provided with a first power lead-out line pattern located on a first layout wiring layer, the second component layout is provided with a second power lead-out line pattern located on the first layout wiring layer, and each of the first power lead-out line pattern and the second power lead-out line pattern extends along the second direction. The first component layout is configured to define a first component, the second component layout is configured to define a second component, the first power lead-out line pattern is configured to define a first power lead-out line, and the second power lead-out line pattern is configured to define a second power lead-out line.

The first main line pattern, the first local line pattern, the second main line pattern and the second local line pattern are located on a second layout wiring layer, and the second layout wiring layer is located above the first layout wiring layer. The first local line pattern is connected with the first power lead-out line pattern through a first plug pattern, and the second main line pattern is connected with the second power lead-out line pattern through a second plug pattern. Alternatively, the first main line pattern is connected with the first power lead-out line pattern through a third plug pattern, and the second local line pattern is connected with the second power lead-out line pattern through a fourth plug pattern. The first plug pattern, the second plug pattern, the third plug pattern and the fourth plug pattern are configured to define a first plug, a second plug, a third plug and a fourth plug, respectively.

In some embodiments, there are a plurality of standard cell layouts. The plurality of standard cell layouts are arranged in an array. In the first direction, the first input line pattern, the first output line pattern, the second input line pattern and the second output line pattern of the standard cell layout are respectively connected with the first main line pattern, the first local line pattern, the second main line pattern and the second local line pattern of another adjacent standard cell layout.

The layout structure further includes: a power connecting line pattern located on a third layout wiring layer. The third layout wiring layer is located above the second layout wiring layer. The power connecting line pattern extends along the second direction and is connected with the first local line pattern or the first output line pattern of each of the plurality of standard cell layouts, the plurality of standard cell layouts being arranged in parallel along the second direction. The power connecting line pattern is configured to define a power connecting line.

In some embodiments, the logic device layout includes at least one of: an inverter layout, a logic gate circuit layout, a buffer layout, or a latch layout. The inverter layout, the logic gate circuit layout, the buffer layout and the latch layout are configured to define an inverter, a logic gate circuit, a buffer and a latch, respectively.

In the semiconductor structure provided by embodiments of the disclosure, the logic device and the switch driving device are arranged in parallel along the first direction, each of the first power line and the second power line of the logic device extends along the first direction, and the first output line, the first power line and the second power line of the switch driving device are located on the same wiring layer. The first output line is connected with the first power line, or the first output line is connected with the second power line. When the switch driving device provides the local power supply to the logic device, the current flows directly from the first output line of the switch driving device into the first power line or the second power line of the logic device, without passing through the interconnection via, so that the resistance value of the local power supply network can be greatly reduced, and the loss in the current transmission process can be reduced, thereby improving the stability of the local power supply of the logic device, and further improving the stability of the delay time of the logic device.

Further, the first power line (or the second power line) and the first output line both extend in the first direction, so as to be connected with each other. Thus, the first power line (or the second power line) and the first output line are relatively short, which can further reduce the resistance value of the local network, thereby reducing the loss in the current transmission process, and improving the stability of the delay time of the logic device.

The above embodiments are only illustrative of the principles and its functions of the disclosure and are not intended to limit the disclosure. Any person familiar with this technique may modify or alter the above embodiments without departing from the spirit and scope of the disclosure. Therefore, all equivalent modifications or changes made by those with ordinary knowledge in the art without departing from the spirit and technical thought disclosed in the disclosure should still be covered by the claims of the disclosure.

The invention claimed is:

1. A semiconductor structure, comprising:
   a logic device, wherein the logic device comprises a first power line and a second power line, the first power line and the second power line are located on a same wiring layer, each of the first power line and the second power line extends along a first direction, and the first power line and the second power line are arranged in parallel along a second direction, wherein the first direction and the second direction intersect with each other and are both parallel to a plane where the wiring layer is located; and
   a switch driving device, wherein the switch driving device and the logic device are arranged in parallel along the first direction, the switch driving device comprises a first input line and a first output line, the first input line, the first output line and the first power line are located on the same wiring layer, each of the first input line and the first output line extends along the first direction, and the first input line and the first output line are arranged in parallel along the second direction, wherein the first output line is connected with the first power line or the second power line.

2. The semiconductor structure according to claim 1, wherein the first power line comprises a first main line and a first local line, the first main line and the first local line are arranged in parallel along the second direction; and
   wherein the first output line is connected with the first local line, and the first input line is connected with the first main line.

3. The semiconductor structure according to claim 2, wherein the second power line comprises a second main line and a second local line, the second main line and the second local line are arranged in parallel along the second direction; and
   wherein the switch driving device further comprises a second input line and a second output line, the second input line, the second output line and the second power line are located on the same wiring layer, each of the second input line and the second output line extends along the first direction, and the second input line and the second output line are arranged in parallel along the second direction, wherein the second input line is connected with the second main line, and the second output line is connected with the second local line.

4. The semiconductor structure according to claim 3, wherein a line width of the first output line along the second direction is equal to a line width of the first local line along the second direction;
   wherein a line width of the first input line along the second direction is equal to a line width of the first main line along the second direction;
   wherein a line width of the second output line along the second direction is equal to a line width of the second local line along the second direction; and wherein a line width of the second input line along the second direction is equal to a line width of the second main line along the second direction.

5. The semiconductor structure according to claim 3, wherein the logic device further comprises a first component and a second component, the first component and the second component are arranged in parallel along the second direction, the first component is provided with a first power lead-out line located on a first wiring layer, the second component is provided with a second power lead-out line located on the first wiring layer, each of the first power lead-out line and the second power lead-out line extends along the second direction;

wherein the first main line, the first local line, the second main line and the second local line are located on a second wiring layer, the second wiring layer is located above the first wiring layer; and wherein the first local line is electrically connected with the first power lead-out line through a first interconnection via, and the second main line is electrically connected with the second power lead-out line through a second interconnection via; or the first main line is electrically connected with the first power lead-out line through a third interconnection via, and the second local line is electrically connected with the second power lead-out line through a fourth interconnection via.

6. The semiconductor structure according to claim 5, wherein the switch driving device further comprises:

a first well region, wherein the first well region comprises at least one first source region, at least one first channel and at least one first drain region, the at least one first source region, the at least one first channel and the at least one first drain region are arranged in parallel along the first direction;

at least one first gate, wherein the at least one first gate is located on the at least one first channel and extends along the second direction;

a first source line, wherein the first source line is located on the first wiring layer, the first source line, the at least one first source region and the first input line are electrically connected with each other, and the first source line extends along the second direction; and a first drain line, wherein the first drain line is located on the first wiring layer, the first drain line, the at least one first drain region and the first output line are electrically connected with each other, and the first drain line extends along the second direction.

7. The semiconductor structure according to claim 6, wherein the first well region includes a plurality of first source regions and a plurality of first drain regions, the plurality of first source regions and the plurality of first drain regions are alternately arranged along the first direction, one first channel is provided between each first source region and an adjacent first drain region, and each first channel is provided with one first gate; and wherein the switch driving device comprises a plurality of first gates, the plurality of first gates are arranged in parallel along the first direction and are connected with each other.

8. The semiconductor structure according to claim 6, wherein the switch driving device further comprises:

a second well region, wherein the second well region and the first well region are arranged in parallel along the second direction, and the second well region comprises at least one second source region, at least one second channel and at least one second drain region, the at least one second source region, the at least one second channel and the at least one second drain region are arranged in parallel along the first direction;

at least one second gate, wherein the at least one second gate is located on the at least one second channel and extends along the second direction;

a second source line, wherein the second source line is located on the first wiring layer, the second source line, the at least one second source region and the second input line are electrically connected with each other, and the second source line extends along the second direction; and a second drain line, wherein the second drain line is located on the first wiring layer, the second drain line, the at least one second drain region and the second output line are electrically connected with each other, and the second drain line extends along the second direction.

9. The semiconductor structure according to claim 8, wherein the second well region comprises a plurality of second source regions and a plurality of second drain regions, the plurality of second source regions and the plurality of second drain regions are alternately arranged along the first direction, one second channel is provided between each second source region and an adjacent second drain region, and each second channel is provided with one second gate; and wherein the switch driving device comprises a plurality of second gates, the plurality of second gates are arranged in parallel along the first direction and are connected with each other.

10. The semiconductor structure according to claim 9, wherein the switch driving device further comprises:

a first gate connecting line, wherein the first gate connecting line and the at least one first gate are located at a same wiring layer, the first gate connecting line extends along the first direction and is configured to connect ends of a plurality of first gates closer to the plurality of second gates with each other;

a second gate connecting line, wherein the second gate connecting line and the plurality of second gates are located at a same wiring layer, the second gate connecting line extends along the first direction and is configured to connect ends of the plurality of second gates closer to the plurality of first gates with each other;

a first auxiliary connecting line located on the first wiring layer, wherein the first auxiliary connecting line comprises a first portion extending along the first direction and a second portion extending along the second direction, the first portion is electrically connected with the first gate connecting line;

a second auxiliary connecting line located on the first wiring layer, wherein the second auxiliary connecting line comprises a third portion extending along the first direction and a fourth portion extending along the second direction, the third portion is electrically connected with the second gate connecting line, wherein an orthographic projection of the second portion at least partially overlaps with an orthographic projection of the fourth portion in a plane perpendicular to the first direction; and a gate control line, wherein the gate control line extends along the first direction and is electrically connected with the second portion and the fourth portion.

11. The semiconductor structure according to claim 5, further comprising a plurality of standard cells, wherein each of the plurality of standard cells comprises the logic device and the switch driving device, and the plurality of standard cells are arranged in an array;

wherein the first input line of any one of the plurality of standard cells is connected with the first main line of another one of the plurality of standard cells which is arranged adjacent to said any one of the plurality of standard cells along the first direction, the first output line of any one of the plurality of standard cells is connected with the first local line of another one of the plurality of standard cells which is arranged adjacent to said any one of the plurality of standard cells along the first direction, the second input line of any one of the plurality of standard cells is connected with the second main line of another one of the plurality of standard cells which is arranged adjacent to said any one of the plurality of standard cells along the first direction, and the second output line of any one of the plurality of standard cells is connected with the second local line of another one of the plurality of standard cells which is arranged adjacent to said any one of the plurality of standard cells along the first direction; and wherein the semiconductor structure further comprises a power connecting line, wherein the power connecting line is located on a third wiring layer, the third wiring layer is located above the second wiring layer, the power connecting line extends along the second direction and is connected with the first local line or the first output line of each of the plurality of standard cells, the plurality of standard cells being arranged in parallel along the second direction.

12. The semiconductor structure according to claim 1, wherein the logic device comprises at least one of: an inverter, a logic gate circuit, a buffer, or a latch.

13. A memory, comprising a semiconductor structure, the semiconductor structure comprising:

a logic device, wherein the logic device comprises a first power line and a second power line, the first power line and the second power line are located on a same wiring layer, each of the first power line and the second power line extends along a first direction, and the first power line and the second power line are arranged in parallel along a second direction, wherein the first direction and the second direction intersect with each other and are both parallel to a plane where the wiring layer is located; and a switch driving device, wherein the switch driving device and the logic device are arranged in parallel along the first direction, the switch driving device comprises a first input line and a first output line, the first input line, the first output line and the first power line are located on the same wiring layer, each of the first input line and the first output line extends along the first direction, and the first input line and the first output line are arranged in parallel along the second direction, wherein the first output line is connected with the first power line or the second power line.

14. A layout structure, comprising:

a logic device layout, wherein the logic device layout comprises a first power line pattern and a second power line pattern, the first power line pattern and the second power line pattern are located on a same layout wiring layer, each of the first power line pattern and the second power line pattern extends along a first direction, and the first power line pattern and the second power line pattern are arranged in parallel along a second direction, the first direction intersects with the second direction, the logic device layout is configured to define a logic device, the first power line pattern is configured to define a first power line, and the second power line pattern is configured to define a second power line; and a switch driving device layout, wherein the switch driving device layout and the logic device layout are arranged in parallel along the first direction, the switch driving device layout comprises a first input line pattern and a first output line pattern, the first input line pattern, the first output line pattern and the first power line pattern are located on the same layout wiring layer, each of the first input line pattern and the first output line pattern extends along the first direction, and the first input line pattern and the first output line pattern are arranged in parallel along the second direction, wherein the first output line pattern extends along the first direction and is connected with the first power line pattern or the second power line pattern, wherein the switch driving device layout is configured to define a switch driving device, the first input line pattern is configured to define a first input line, and the first output line pattern is configured to define a first output line.

15. The layout structure according to claim 14, wherein the layout structure comprises a standard cell layout, wherein the standard cell layout comprises the logic device layout and the switch driving device layout, and the standard cell layout is configured to define a standard cell.

* * * * *